(12) United States Patent
Palaniappan et al.

(10) Patent No.: US 8,947,966 B2
(45) Date of Patent: Feb. 3, 2015

(54) POWER GATED MEMORY DEVICE WITH POWER STATE INDICATION

(75) Inventors: Sathappan Palaniappan, Sivaganaga District (IN); Romeshkumar Mehta, Maharashtra (IN); Dharmesh Tirthdasani, Ahmedabad (IN)

(73) Assignee: LSI Corporation, San Jose, CA (US)

( * ) Notice: Subject to any disclaimer, the term of this patent is extended or adjusted under 35 U.S.C. 154(b) by 317 days.

(21) Appl. No.: 13/493,081

(22) Filed: Jun. 11, 2012

(65) Prior Publication Data

US 2013/0332763 A1 Dec. 12, 2013

(51) Int. Cl.
*G11C 5/14* (2006.01)

(52) U.S. Cl.
USPC .......................... 365/226; 365/227; 365/229

(58) Field of Classification Search
CPC ............ G11C 7/22; G11C 7/222; G11C 8/18; G11C 29/028; G11C 29/14; G11C 7/10; G11C 11/4093; G11C 11/4096; G11C 11/413; G11C 29/24; G11C 5/14; G11C 7/02; G11C 8/00; G11C 8/08; G11C 8/10
USPC .......................................... 365/226, 227, 229
See application file for complete search history.

(56) References Cited

U.S. PATENT DOCUMENTS

| | | | |
|---|---|---|---|
| 6,298,002 B1 | 10/2001 | Brooks et al. | |
| 6,597,620 B1 | 7/2003 | McMinn | |
| 7,302,599 B2 * | 11/2007 | Gaskins et al. | 713/322 |
| RE40,205 E * | 4/2008 | Funaba et al. | 365/194 |
| 7,859,936 B1 | 12/2010 | Vasudevan | |
| 2011/0101998 A1 | 5/2011 | Myers et al. | |
| 2011/0204963 A1* | 8/2011 | Kim | 327/536 |

* cited by examiner

*Primary Examiner* — Hien Nguyen

(57) ABSTRACT

A memory device comprises one or more power gates and state signaling circuitry. Each of the one or more power gates is configurable such that a respective portion of the memory device is powered down. The state signaling circuitry is operative to produce a power state output signal indicative of when the one or more power gates are configured such that the memory device is fully powered up.

19 Claims, 3 Drawing Sheets

FIG. 3

|    | RDC | CDC | MAC | ORC |
|----|-----|-----|-----|-----|
| LS | X   | X   |     |     |
| DS | X   | X   |     | X   |
| SD | X   | X   | X   | X   |

X = POWERED DOWN

POWER GATED MEMORY DEVICE WITH POWER STATE INDICATION

BACKGROUND

A modern integrated circuit memory device frequently includes one or more power-gating mechanisms that allow the power consumption for that memory device to be reduced while the memory device is not in active use. Such a memory device may, for example, include one or more pins that allow the memory device to be placed in one of several power-saving modes, such as a "light sleep" mode, a "deep sleep" mode, and a "shut-down" mode. Each of these power-saving modes utilizes sufficiently-sized power gates (e.g., metal-oxide-semiconductor field effect transistors (MOSFETs)) to progressively power down more circuitry within the memory device. In the light sleep mode, for example, just the memory device's row and column decoders may be powered down. In contrast, in the more extreme shut-down mode, all the circuitry within the memory device may be powered down including the memory's memory array and any output restoration circuitry. In the shut-down mode, all stored data is typically lost.

There is typically some delay in powering the elements within a memory device up to their fully functional status when restoring a memory device from a power-saving mode. This recovery time is frequently specified by the manufacturer and must be accounted for by means of a data processing system's firmware. Accessing a memory device when the memory device has not fully exited from a power-saving mode can result in unpredictable behavior including data loss.

SUMMARY

Embodiments of the invention provide novel methods and apparatus for performing power gating in a memory device. Power gates (e.g., p-type MOSFETS (PFETs)) are placed into the memory circuitry in such a manner that different portions of the memory device may be disconnected from the power supply voltage and thereby powered down. At the same time, state signaling circuitry monitors the on/off states of the power gates and indicates when the power gates are configured such that the memory device is fully powered up. When the state signaling circuitry indicates that the memory device is partially powered down, a data processing unit is inhibited from initiating a memory access on the memory device. With such a definite handshake mechanism, the data processing unit need not rely on an empirical recovery time for each of the memory device's power-saving modes. Accordingly, the risks associated with early accesses on the memory device, such as data loss, are mitigated.

In accordance with an aspect of the invention, a memory device comprises one or more power gates and state signaling circuitry. Each of the one or more power gates is configurable such that a respective portion of the memory device is powered down. The state signaling circuitry is operative to produce a power state output signal indicative of when the one or more power gates are configured such that the memory device is fully powered up.

In accordance with another aspect of the invention, power gating is performed in a memory device. One or more power gates are formed into the memory device. Each of the one or more power gates is configurable such that a respective portion of the memory device is powered down. In addition, state signaling circuitry is also formed into the memory device. The state signaling circuitry is operative to produce a power state output signal indicative of when the one or more power gates are configured such that the memory device is fully powered up.

In accordance with yet another aspect of the invention, an integrated circuit comprises at least one memory device. The memory device, in turn, comprises one or more power gates and state signaling circuitry. Each of the one or more power gates is configurable such that a respective portion of the memory device is powered down. The state signaling circuitry is operative to produce a power state output signal indicative of when the one or more power gates are configured such that the memory device is fully powered up.

Embodiments of the present invention will become apparent from the following description of embodiments thereof, which are to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 3 shows a table of power status for several portions of the FIG. 2 memory device as a function of asserted power gating signal in accordance with an illustrative embodiment of the invention.

Figure 1:
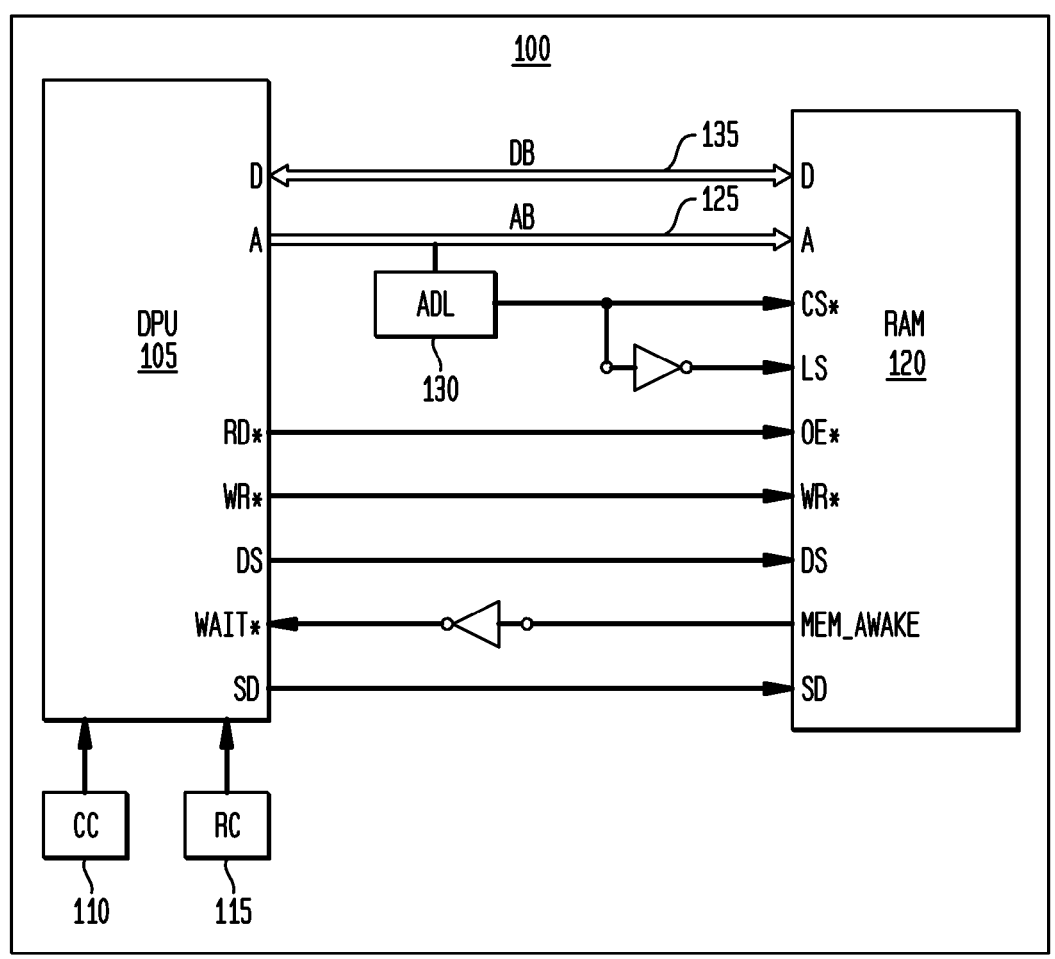
FIG. 1 shows a block diagram of at least a portion of an illustrative data processing system in accordance with an illustrative embodiment of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DESCRIPTION OF EMBODIMENTS

Embodiments of the invention will be described herein in the context of illustrative memory devices with unique power-gating capabilities. It should be understood, however, that embodiments falling within the scope of the appended claims are not limited to these or any other particular circuit arrangements. It will become apparent to those skilled in the art, given the teachings herein, that numerous modifications can be made to the embodiments shown that are within the scope of the claimed invention. That is, no limitations with respect to the specific embodiments described herein are intended or should be inferred.

As a preliminary matter, for the purposes of clarifying and describing embodiments of the invention, the following table provides a summary of certain acronyms and their corresponding definitions, as the terms are used herein:

| Table of Acronym Definitions | |
|---|---|
| Acronym | Definition |
| MOSFET | Metal-oxide-semiconductor field effect transistor |
| DPU | Data processing unit |
| CC | Clock circuitry |
| RC | Reset circuitry |
| AB | Address bus |

-continued

Table of Acronym Definitions

| Acronym | Definition |
| --- | --- |
| DB | Data bus |
| ADL | Address decoding logic |
| CMOS | Complementary metal-oxide-semiconductor |
| PFET | p-type MOSFET |
| NFET | n-type MOSFET |
| RAM | Random-access memory |
| RDC | Row decoder circuitry |
| CDC | Column decoder circuitry |
| MAC | Memory array circuitry |
| ORC | Output restore circuitry |
| Vdd | Power supply voltage |
| Vss | Ground voltage |
| D | Read/Write data |
| A | Address data |
| RD | Read |
| WR | Write |
| CS | Column select |
| LS | Light sleep |
| DS | Deep sleep |
| SD | Shut-down |
| OE | Output enable |

For the purpose of describing and claiming the invention, the term MOSFET as used herein is intended to be construed broadly and to encompass any type of metal-insulator-semiconductor field effect transistor. The term MOSFET is, for example, intended to encompass semiconductor field effect transistors that utilize an oxide material as their gate dielectric, as well as those that do not. In addition, despite a reference to the term "metal" in the acronym MOSFET, the term MOSFET is also intended to encompass semiconductor field effect transistors wherein the gate is formed from a non-metal such as, for instance, polysilicon.

In addition, for ease of understanding, those control signals described herein that are configured as active-low are designated with asterisks (*) after their respective signal names. Nevertheless, the assignment of active-low signaling for many of the control signals is largely to conform to convention. As a result, active-high signaling could be substituted for active-low signaling where desired, with or without modification to the circuits shown, and the results would still come within the scope of embodiments of the invention.

FIG. 1 shows a block diagram of at least a portion of a data processing system 100 in accordance with an illustrative embodiment of the invention. The exemplary data processing system 100 comprises a data processing unit (DPU) 105 that receives a clock signal from clock circuitry (CC) 110 as well as a reset (RST*) control signal from reset circuitry (RC) 115. At the same time, the data processing unit 105 is in signal communication with a random-access memory (RAM) 120 via several buses and control signal lines.

When the data processing unit 105 wants to read a location in the random-access memory 120, it asserts an appropriate address for that location on an address bus (AB) 125. This, in turn, causes address decoding logic (ADL) 130 to assert a chip select (CS*) control signal for the random-access memory 120, which is received by the random-access memory 120 and enables that device. After allowing time for the CS* control signal to propagate, the data processing unit 105 next asserts a read (RD*) control signal. The RD* control signal is received by the random-access memory 120 as an output enable (OE*) control signal, which informs the random-access memory 120 that a read is requested. The random-access memory 120 then drives a data bus (DB) 135 with data read from the requested location in the random-access memory indicated by the address. After allowing sufficient time for the read data to be driven, the data processing unit 105 captures the data and releases the RD* control signal to complete the read access.

Write accesses are performed in a similar manner. In this case, the data processing unit 105 asserts the appropriate address within the random-access memory 120 on the address bus 125, and, at substantially the same time, drives the write data onto the data bus 135. As before, the address data on the address bus 125 causes the address decoding logic 130 to assert the CS* control signal for the random-access memory 120, which is received by the random-access memory 120 and enables that device. After allowing sufficient time for the address and write data to stabilize on the address bus 125 and data bus 135, respectively, as well as sufficient time for the CS* control signal to propagate, the data processing unit 105 then asserts the WR* control signal. The WR* control signal is received by the random-access memory 120, which informs the random-access memory 120 that a write is requested. The random-access memory 120 is then able to store the data on the data bus 135 at the address indicated on the address bus 125. The WR* control signal is subsequently preferably de-asserted while the write data, the address data, and the CS* control signal are still stable so as to lessen the possibility of writing to an improper location on the random-access memory 120. If the WR* control signal is de-asserted at the same time as the other control signals, a race condition can develop.

While reading data from and writing data to the random-access memory 120 is largely conventional, the data processing system 100 differs substantially from conventional data processing systems in terms of the manner in which it handles power gating. More precisely, power gating circuitry in the random-access memory 120 is operative to power down several portions of the memory device in response to input power gating signals. In the present embodiment, for example, the power gating circuitry is operative to place the random-access memory 120 into three distinct power-saving modes, namely, a light sleep mode, a deep sleep mode, and a shut-down mode. It is to be appreciated, however, that the number of distinct power-saving modes provided is not limited to three; rather, less than three (e.g., two) or greater than three (e.g., four) power-saving modes are similarly contemplated and within the scope of embodiments of the invention, as will become apparent to those skilled in the art given the teachings herein. As one moves from the light sleep mode to the shut-down mode, a progressively larger portion of the random-access memory 120 is powered down, facilitating greater power savings. At the same time, the power gating circuitry is also operative to produce a power state output signal that indicates when the random-access memory 120 is again fully powered up from a power-saving mode.

In the exemplary data processing system 100, these unique power gating capabilities are implemented utilizing several power gating signals, namely, a light sleep (LS) power gating signal, a deep sleep (DS) power gating signal, and a shut-down (SD) power gating signal that originate in the data processing unit 105 in this exemplary embodiment. The power gating signals act to control power gating circuitry within the random-access memory 120. The random-access memory 120 can, for example, be placed into its light sleep power-saving mode by asserting the LS power gating signal while the DS and SD power gating signals remain de-asserted. In the present non-limiting embodiment, the LS power gating signal is merely an inverted form of the CS* control signal, meaning that at least a light sleep power-saving mode is achieved when the random-access memory 120 is not being actively accessed. The random-access memory 120 can be placed into its deep sleep mode by asserting the DS control signal while the SD power gating signal is de-asserted. Lastly, the random-access memory 120 can be placed into its shut-down mode by asserting a shut-down (SD) power gating signal.

In return, the random-access memory 120 produces a memory-awake (MEM_AWAKE) state signal indicative of when the random-access memory 120 is again fully powered up from a power-saving mode after the asserted power gating signal(s) are de-asserted. The MEM_AWAKE state signal, after being inverted, is received by the data processing unit 105 as a wait (WAIT*) control signal. The data processing unit 105 is inhibited from initiating a memory access on the random-access memory 120 while the WAIT* control signal is asserted. By being inhibited by the WAIT* control signal in this fashion, the data processing unit 105 is thereby prevented from accessing the random-access memory 120 while the random-access memory 120 has not fully exited from a power saving mode.

Figure 2:
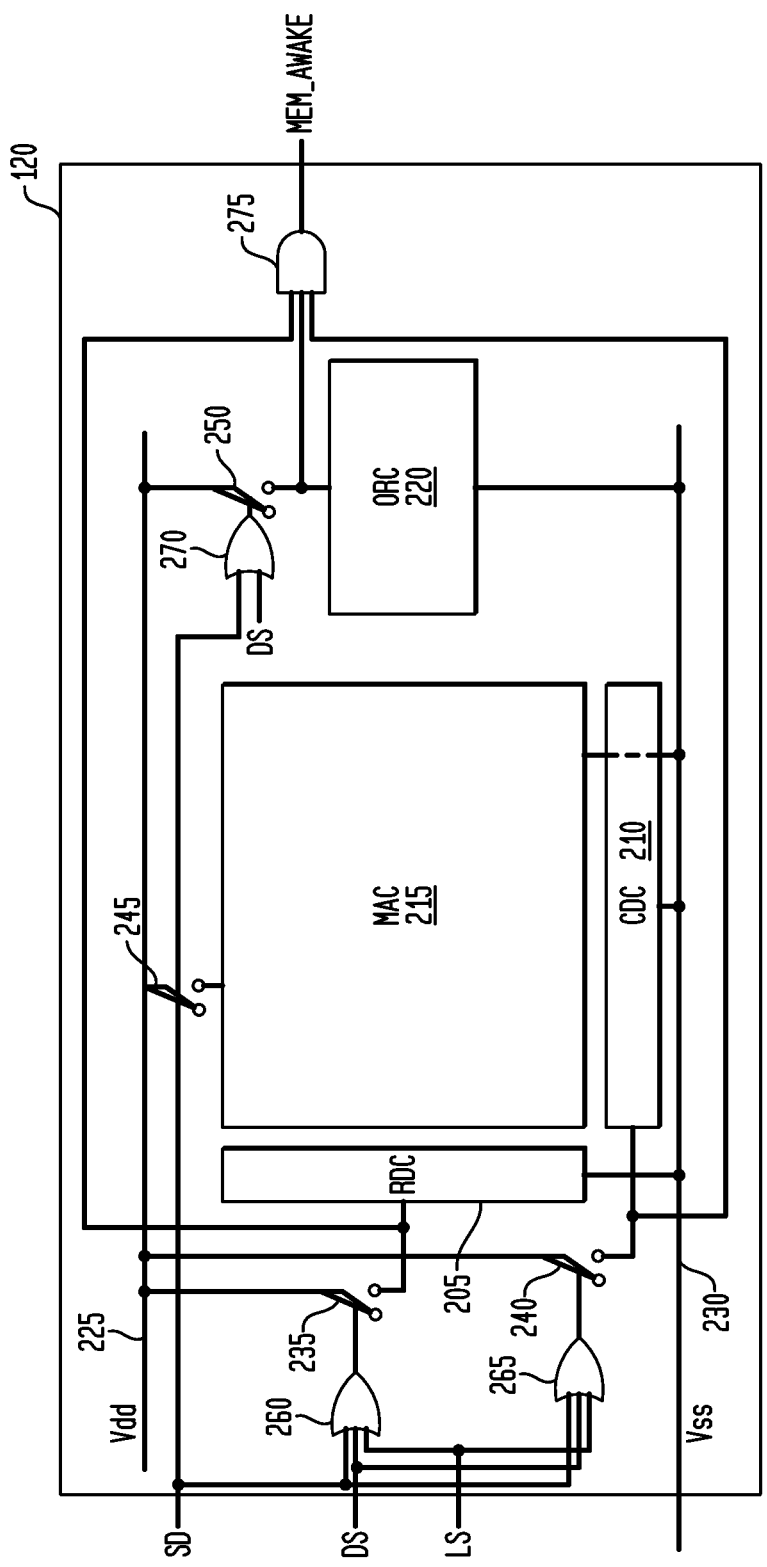
FIG. 2 shows a schematic diagram of at least a portion of an illustrative memory device within the FIG. 1 data processing system in accordance with an illustrative embodiment of the invention.

The manner in which the power gating circuitry in the random-access memory 120 responds to the LS, DS, and SD power gating signals, as well as the manner in which the power gating circuitry generates the MEM_AWAKE state signal, are further elucidated by FIG. 2. FIG. 2 shows a schematic diagram of at least a portion of the random-access memory 120 in accordance with an illustrative embodiment of the invention. In this figure, only those circuit elements related to power gating are explicitly shown for economy of description. Nevertheless, it is recognized that working embodiments in accordance with aspects of the invention would contain additional circuitry that is not specifically shown in FIG. 2, such as sense amplifiers, write drivers, multiplexers, controllers, etc. Since this additional circuitry is largely conventional, it will already be familiar to one having ordinary skill in the electronic arts. Moreover, conventional aspects of semiconductor memory devices are described in detail in a number of readily available publications, such as T. P. Haraszti, *CMOS Memory Circuits*, Springer, 2000; and M-B Lo, *Introduction to VLSI Systems: A Logic, Circuit, and System Perspective*, CRC Press, 2011; which are both hereby incorporated by reference herein.

The random-access memory 120 comprises row decoder circuitry (RDC) 205, column decoder circuitry (CDC) 210, memory array circuitry (MAC) 215, and output restore circuitry (ORC) 220. The output restore circuitry 220 allows the memory output of the random-access memory 120 to be stored before the random-access memory 120 is placed into its deep sleep power-saving mode (where the random-access memory's output is held at logical low values) and then subsequently quickly reinstated after the random-access memory 120 is powered back up. Each of the row decoder circuitry 205, the column decoder circuitry 210, the memory array circuitry 215, and the output restore circuitry 220 are powered by a respective connection to a power supply voltage (Vdd) rail 225 and a respective connection to a ground voltage (Vss) rail 230. Power gating, in turn, is facilitated by the addition of a respective power gate on each of the connections to the Vdd rail 225. More precisely, a first power gate 235 is located on the row decoder circuitry's connection to the Vdd rail 225, a second power gate 240 is located on the column decoder circuitry's connection to the Vdd rail 225, a third power gate 245 is located on the memory array circuitry's connection to the Vdd rail 225, and a fourth power gate 250 is located on the output restore circuitry's connection to the Vdd rail 225. In the present non-limiting embodiment, each of these power gates 235, 240, 245, 250 is switched off (i.e., switched such that substantially no current flows through the power gate) when receiving a logical high input voltage on their respective control terminals, and switched on (i.e., switched such that current flows through the power gate with a reasonably small resistance) when receiving a logical low input voltage on their respective control terminals, as would be the case were the power gates 235, 240, 245, 250 appropriately sized PFETs.

Three OR gates, namely, a first OR gate 260, a second OR gate 265, and a third OR gate 270, cooperate with the four power gates 235, 240, 245, 250 to appropriately power down portions of the random-access memory 120 in response to the LS, DS, and SD power gating signals. The manner in which assertion of the LS, DS, and SD power gating signals variously power down the row decoder circuitry 205, the column decoder circuitry 210, the memory array circuitry 215, and the output restore circuitry 220 is described in the table in FIG. 3. In the illustrative random-access memory 120, the output of the first OR gate 260 is connected to the control terminal of the first power gate 235, and the output of the second OR gate 265 is connected to the control terminal of the second power gate 240. At the same time, each of the first OR gate 260 and the second OR gate 265 receives the LS, the DS, and the SD power gating signals as inputs. Asserting any one of the LS, DS, and SD power gating signals therefore has the effect of causing the first OR gate 260 and the second OR gate 265 to output a logical high signal to the respective control terminals of the first power gate 235 and the second power gate 240, which causes them to switch off. Once the first power gate 235 and the second power gate 240 are switched off, the row decoder circuitry 205 and the column decoder circuitry 210 are effectively disconnected from the Vdd rail 225 and powered down. The output of the third OR gate 270, moreover, is connected to the control terminal of the fourth power gate 250, while the third OR gate 270 receives the DS and SD power gating signals as inputs. Accordingly, assertion of the DS or SD power gating signals has the further effect of causing the fourth power gate 250 to switch off, thereby powering down the output restore circuitry 220. Lastly, the SD power gating signal is connected to the control terminal of the third power gate 245. Assertion of the SD power gating signal therefore has the further effect of powering down the memory array circuitry 215.

Causing all three of the power gating signals to be de-asserted subsequent to placing the random-access memory 120 into a power-saving mode has the effect of causing, after some time delay for propagation and switching, all the power gates 235, 240, 245, 250 to be switched on. Power to the entirety of the random-access memory 120 is thereby ultimately reestablished. As indicated above, the reestablishment of power is signaled by the MEM_AWAKE state signal which, once inverted, becomes the WAIT* control signal for the data processing unit 105. In the present embodiment, the MEM_AWAKE state signal is formulated from the output of an AND gate 275. This AND gate 275, in turn, receives the respective output of each of the first power gate 235, the second power gate 240, and the fourth power gate 250 as an input. Accordingly, only when each of these three power gates 235, 240, 250 is switched on so as to produce a logical high output can the AND gate 275 itself also produce a logical high output. Notably, the output of the third power gate 245 is not also routed to the AND gate 275. This is simply because it is assumed in the present illustrative memory design that power will be restored to the memory array circuitry 215 faster than the output restore circuitry 220 when the SD power gating control signal is de-asserted because of the presence of the extra circuitry associated with the third OR gate 270.

Embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in FIGS. 1 and 2, or portions thereof, may be part of an integrated circuit.

If implemented in an integrated circuit, for example, the random-access memory 120 may be formed utilizing a complementary metal-oxide-semiconductor (CMOS) fabrication technology. In such a case, suitable designs for the AND and OR gates may be found in commonly available CMOS cell libraries. The power gates 235, 240, 245, 250 may each comprise a respective PFET. When PFETs are utilized, for example, the first power gate 235 may comprise a PFET with its source terminal tied to the Vdd rail 225, its drain terminal (i.e., output) tied to row decoder circuitry 205 and the AND gate 275, and its gate terminal tied to the output of the OR gate 260. To avoid excessive power consumption, voltage drops, and resistance-capacitance-induced time delays, any PFETs serving as the power gates 235, 240, 245, 250 are preferably of a large enough size to provide relatively small channel resistances. That said, while PFETs may be suitable for the power gates 235, 240, 245, 250, one having ordinary skill in the electronic arts will also recognize that similar power gating functions may be accomplished by utilizing n-channel MOSFETs (NFETs) instead of PFETs with only very minor modifications to the design (e.g., the addition of inverters). In addition, the skilled artisan will further recognize that footer power gates that act to connect and disconnect the various portions of the random-access memory's circuitry from the Vss rail 230 may provide an equally suitable substitute for the header power gates 235, 240, 245, 250 shown in the embodiment in FIG. 2. In other embodiments, both header and footer power gates can be employed. Such additional embodiments would still come within the scope of embodiments of the invention.

Once formed, an integrated circuit in accordance with embodiments of the invention can be employed in essentially any application and/or electronic system in which a memory device (e.g., standalone or embedded) is utilized. Suitable systems for implementing techniques of the invention may include, but are not limited to, personal computers, communication systems, electronic instruments (e.g., automated test equipment (ATE)), interface networks, high-speed memory interfaces (e.g., DDR3, DDR4), storage systems, etc. Systems incorporating such integrated circuits are also considered part of this invention.

As indicated earlier, when restoring a memory device from a power-saving mode to a fully powered up state, there is typically some delay in powering the various elements in the memory device up to their fully functional status. In conventional memory devices, this recovery time is frequently specified by the manufacturer and must be accounted for by means of a data processing system's firmware so that memory accesses are not initiated while the memory device is not fully powered up. Nevertheless, such specified recovery times may be in error for several reasons. The memory manufacturer may not have benchmarked the memory device sufficiently after the device was physically formed in an integrated circuit. In addition, recovery times may depend on varying operating parameters. Lastly, the manufacturer may add extra time to a specified recovery time in order to provide some safety margin.

The power gating circuitry in the present illustrative embodiment instead produces the MEM_AWAKE state signal indicative of when the four power gates 235, 240, 245, 250 are configured such that the random-access memory 120 is fully powered up. The MEM_AWAKE state signal thereby forms a "wake-up" flag that, when used as a WAIT* control signal by the data processing unit 105, can inhibit the data processing unit 105 from initiating a memory access before the random-access memory 120 has fully exited from a power-saving mode. With such a definite handshake mechanism, the data processing unit 105 need not rely on an empirical recovery time for each of the power-saving modes. Accordingly, the risks associated with early accesses on the random-access memory 120 are mitigated.

It should again be emphasized that the above-described embodiments of the invention are intended to be illustrative only. Other embodiments may use different types and arrangements of elements for implementing the described functionality. For example, while three power gating signals and four power gates 235, 240, 245, 250 are utilized to control power gating in the illustrative random-access memory 120 described in detail above, a memory device in accordance with aspects of the invention may utilize a larger or smaller number of power gating signals and/or power gates. Alternative embodiments may also utilize very different logical relationships between power gating signals and power gates to achieve a desired functionality. These numerous alternative embodiments within the scope of the appended claims will be apparent to one skilled in the art given the teachings herein.

Moreover, although embodiments of the present invention described herein may be implemented using PFETs and NFETs, as may be formed using a CMOS fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. In addition, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

The features disclosed herein may be replaced by alternative features serving the same, equivalent, or similar purposes, unless expressly stated otherwise. Thus, unless expressly stated otherwise, each feature disclosed is one example only of a generic series of equivalent or similar features.

What is claimed is:

1. A memory device comprising:
   a plurality of power gates, each of the power gates being configured to independently control a power down of corresponding circuitry in the memory device; and
   state signaling circuitry, the state signaling circuitry operative to produce a power state output signal indicative of when the power gates are configured such that the memory device is fully powered up.

2. The memory device of claim 1, wherein the memory device comprises a random access memory.

3. The memory device of claim 2, wherein at least one of the plurality of power gates is configured to power down row decoding circuitry in the memory device.

4. The memory device of claim 2, wherein at least one of the plurality of power gates is configured to power down column decoding circuitry in the memory device.

5. The memory device of claim 2, wherein at least one of the plurality of power gates is configured to power down memory array circuitry in the memory device.

6. The memory device of claim 2, wherein at least one of the plurality of power gates is configured to power down output recovery circuitry in the memory device.

7. The memory device of claim 1, wherein at least one of the plurality of power gates is configured to disconnect its corresponding circuitry in the memory device from a power voltage source.

8. The memory device of claim 1, wherein at least one of the plurality of power gates is configured to disconnect its corresponding circuitry in the memory device from a ground voltage source.

9. The memory device of claim 1, wherein the plurality of power gates is controlled at least in part by one or more input power gating signals.

10. The memory device of claim 9, wherein at least one of the plurality of power gates is controlled by a signal received from an OR gate.

11. The memory device of claim 10, wherein the OR gate receives at least one of the one or more input power gating signals as an input.

12. The memory device of claim 9, wherein the plurality of power gates receives the one or more input power gating signals from one or more data processing units.

13. The memory device of claim 12, wherein the power state output signal is transmitted to the one or more data processing units.

14. The memory device of claim 12, wherein each of the one or more data processing units is operative to access the memory device only when the power state output signal indicates that the memory device is fully powered up.

15. The memory device of claim 1, wherein the state signaling circuitry produces the power state output signal at least in part from the respective outputs of at least one of the plurality of power gates.

16. The memory device of claim 1, wherein the state signaling circuitry produces the power state output signal at least in part utilizing an AND gate that receives the respective outputs of at least one of the plurality of power gates as an input.

17. The memory device of claim 1, wherein at least one of the plurality of power gates comprises a MOSFET.

18. A method for performing power gating in a memory device, the method comprising the steps of:
    forming a plurality of power gates into the memory device, each of the power gates being configured to independently control a power down of corresponding circuitry in the memory device; and
    forming state signaling circuitry into the memory device, the state signaling circuitry operative to produce a power state output signal indicative of when the power gates are configured such that the memory device is fully powered up.

19. An integrated circuit comprising a memory device, the memory device comprising:
    a plurality of power gates, each of the power gates being configured to independently control a power down of corresponding circuitry in the memory device; and
    state signaling circuitry, the state signaling circuitry operative to produce a power state output signal indicative of when the power gates are configured such that the memory device is fully powered up.

* * * * *